(12) United States Patent
Tseng et al.

(10) Patent No.: US 10,978,442 B2
(45) Date of Patent: Apr. 13, 2021

(54) ELECTROSTATIC DISCHARGE (ESD) PROTECTION DEVICE AND FORMING METHOD THEREOF

(71) Applicant: UNITED MICROELECTRONICS CORP., Hsin-Chu (TW)

(72) Inventors: Ying-Wei Tseng, Nantou County (TW); Chun Chiang, Hsinchu (TW); Ping-Chen Chang, Pingtung County (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/446,599

(22) Filed: Jun. 19, 2019

(65) Prior Publication Data
US 2020/0381415 A1    Dec. 3, 2020

(30) Foreign Application Priority Data
May 29, 2019  (TW) ................. 108118572

(51) Int. Cl.
*H01L 27/02* (2006.01)
(52) U.S. Cl.
CPC ...... *H01L 27/0248* (2013.01); *H01L 27/0207* (2013.01)

(58) Field of Classification Search
CPC ..................................... H01L 23/60
See application file for complete search history.

(56) References Cited

U.S. PATENT DOCUMENTS

| | | | |
|---|---|---|---|
| 6,365,924 B1 | 4/2002 | Wang | |
| 7,508,038 B1* | 3/2009 | Ransom | H01L 23/60 257/360 |
| 8,878,296 B1* | 11/2014 | Jensen | H01L 23/60 257/355 |
| 2007/0262386 A1* | 11/2007 | Gossner | H01L 29/7436 257/355 |
| 2011/0121395 A1* | 5/2011 | Kim | H01L 29/7408 257/361 |

* cited by examiner

*Primary Examiner* — Thao P Le
(74) *Attorney, Agent, or Firm* — Winston Hsu

(57) ABSTRACT

An electrostatic discharge (ESD) protection device and a method thereof are presented. A well is disposed in a substrate. A gate is disposed on the well. A source region and a drain region are located in the well and at two opposite sides of the gate respectively. A first doped region is located in the drain region, wherein the first doped region is electrically connected to the drain region. A second doped region is located in the source region, wherein the second doped region is electrically connected to the source region. A third doped region is located in the well and at a side of the drain region opposite to the gate. A fourth doped region is located in the well and at a side of the source region opposite to the gate, wherein the fourth doped region is electrically connected to the third doped region.

18 Claims, 8 Drawing Sheets

ELECTROSTATIC DISCHARGE (ESD) PROTECTION DEVICE AND FORMING METHOD THEREOF

BACKGROUND OF THE INVENTION

1. Field of the Invention

The present invention relates to a protection device and a forming method thereof, and more particularly, to an electrostatic discharge (ESD) protection device and a forming method thereof.

2. Description of the Prior Art

Chips and/or integrated circuits (ICs) are the most essential hardware foundation of the modern information field. As products based on ICs become more delicate, they also become more vulnerable to the impacts of the external environment. For example, it is found that electrostatic discharge (ESD) is a constant threat to modern electronics. The result of ESD on unprotected ICs is often destruction, characterized by melting or explosion of apart of the ICs. Therefore, the ESD protection devices are regarded as important components of the protection circuitry provided in electronic devices. Typically, during a normal IC operation, the ESD protection device is turned off. When an ESD event occurs, the ESD surges will cause the ESD protection device breakdown and create a substrate current path, through which the ESD current is diverted to ground and thus the core circuit is protected. There are some essential characteristics of the ESD protection device, such as low on resistance, low trigger voltage, and high withstanding voltage, and it is important to figure out effective approaches of improving the characteristics mentioned above for the related field.

SUMMARY OF THE INVENTION

The present invention provides an electrostatic discharge (ESD) protection device and a forming method thereof, which forms doped regions in a drain region and a source region respectively, and forms doped regions outside the drain region and the source region respectively. Thereby, an electrostatic discharge (ESD) protection device having a silicon-controlled rectifier (SCR) structure, low trigger voltage, and high withstanding voltage can be formed.

The present invention provides an electrostatic discharge (ESD) protection device including a well, a gate, a source region, a drain region, a first doped region, a second doped region, a third doped region and a fourth doped region. The well having a first conductive type is disposed in a substrate. The gate is disposed on the well. The source region and the drain region both having a second conductive type are located in the well and at two opposite sides of the gate respectively, wherein the second conductive type is different from the first conductive type. The first doped region having the first conductive type is located in the drain region, wherein the first doped region is electrically connected to the drain region. The second doped region having the first conductive type is located in the source region, wherein the second doped region is electrically connected to the source region. The third doped region having the first conductive type is located in the well and at a side of the drain region opposite to the gate. The fourth doped region having the first conductive type is located in the well and at a side of the source region opposite to the gate, wherein the fourth doped region is electrically connected to the third doped region.

The present invention provides a method of forming electrostatic discharge (ESD) protection device including the following steps. A substrate is provided. A well having a first conductive type is formed in the substrate. A gate is formed on the well. A source region and a drain region both having a second conductive type are formed in the well and at two opposite sides of the gate respectively, wherein the second conductive type is different from the first conductive type. A first doped region having the first conductive type is formed in the drain region. A second doped region having the first conductive type is formed in the source region. A third doped region having the first conductive type is formed in the well and at a side of the drain region opposite to the gate. A fourth doped region having the first conductive type is formed in the well and at a side of the source region opposite to the gate. The fourth doped region is electrically connected to the third doped region.

According to the above, the present invention provides an electrostatic discharge (ESD) protection device and a forming method thereof, which forms a well having a first conductive type in a substrate; a gate is disposed on the well; a source region and a drain region both having a second conductive type are located in the well and at two opposite sides of the gate respectively, wherein the second conductive type is different from the first conductive type; a first doped region having the first conductive type is located in the drain region, wherein the first doped region is electrically connected to the drain region; a second doped region having the first conductive type is located in the source region, wherein the second doped region is electrically connected to the source region; a third doped region having the first conductive type is located in the well and at a side of the drain region opposite to the gate; a fourth doped region having the first conductive type is located in the well and at a side of the source region opposite to the gate, wherein the fourth doped region is electrically connected to the third doped region. By doing this, the electrostatic discharge (ESD) protection device includes a silicon-controlled rectifier (SCR) structure and a back-to-back diode structure. These structures enhance the electrical performance of electrostatic discharge (ESD) protection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
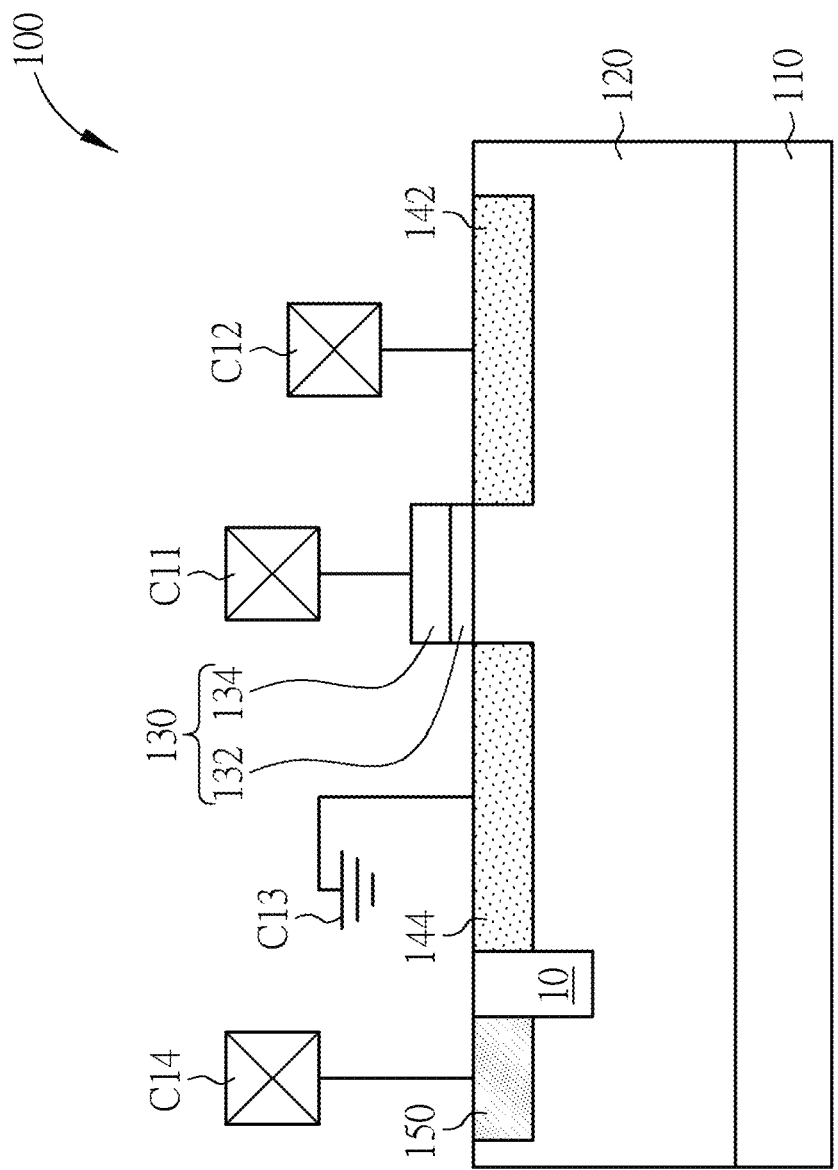
FIG. 1 schematically depicts a cross-sectional view of a non-ESD protection transistor according to an embodiment of the present invention.

FIG. 1 schematically depicts a cross-sectional view of a non-ESD protection transistor according to an embodiment of the present invention. A substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. A well 120, which may be formed by a doping process, is formed in the substrate 110. In a preferred embodiment, the well 120 has a first conductive type while the substrate 110 has a second conductive type, wherein the second conductive type is different from the first conductive type. For example, the first conductive type is N-type while the second conductive type is P-type, but it is not limited thereto. An isolation structure 10 is selectively formed in the substrate 110. The isolation structure 10 may be a shallow trench isolation (STI) structure, which may be formed by a shallow trench isolation (STI) process, but it is not limited thereto.

A gate 130 is formed on the well 120. The gate 130 may include a gate dielectric layer 132 and a gate electrode 134 stacked from bottom to top. The gate dielectric layer 132 may be an oxide layer, and the gate electrode 134 may be a polysilicon layer, but it is not limited thereto. A drain region 142 and a source region 144 are formed in the well 120 and respectively at two opposite sides of the gate 130. The drain region 142 and the source region 144 both have the second conductive type such as P-type. A base region 150 is formed at a side of the isolation structure 10 opposite to the source region 144. The base region 150 has the first conductive type such as N-type. The base region 150 is electrically isolated from the source region 144 by the isolation structure 10. The gate 130, the drain region 142, the source region 144 and the base region 150 are electrically connected outwards respectively by contact plugs C11/C12/C13/C14. Thereby, a non-ESD protection transistor 100 is formed.

Figure 2:
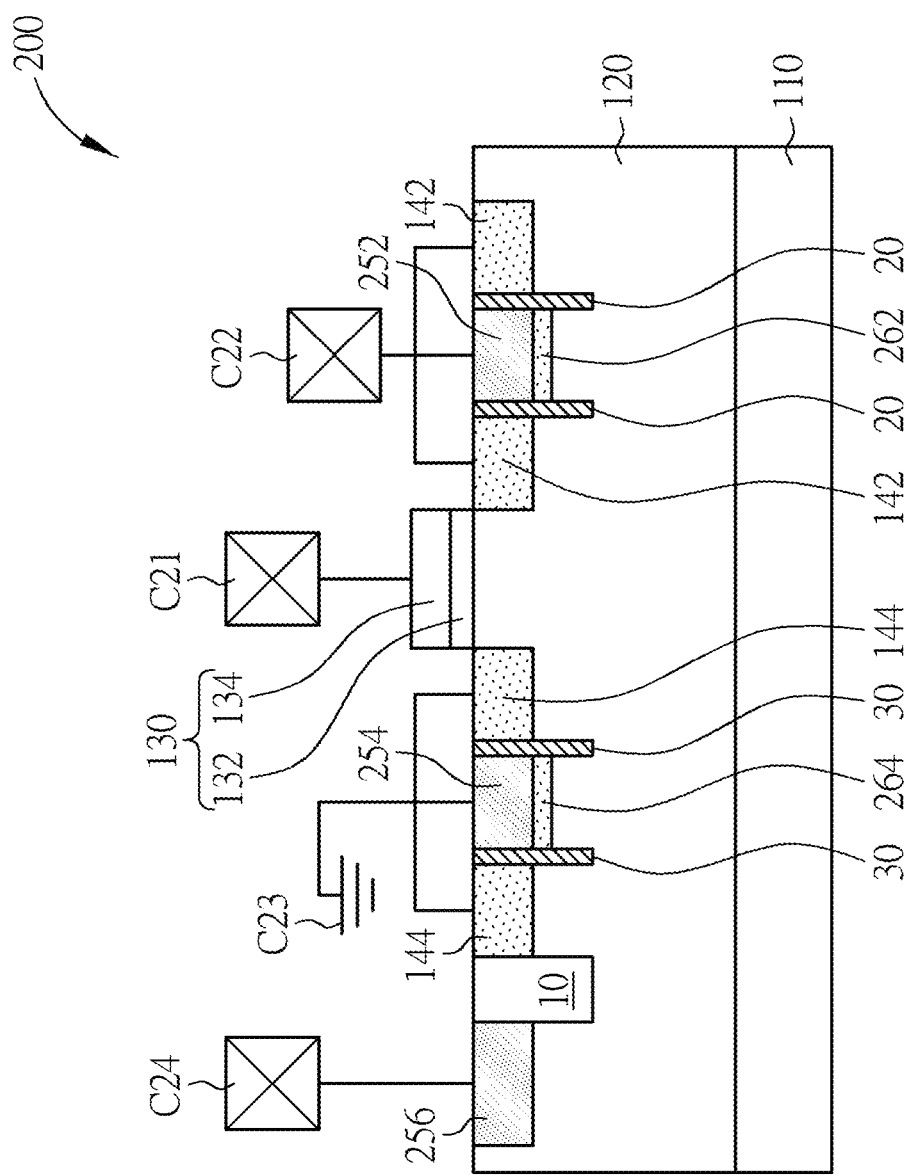
FIG. 2 schematically depicts a cross-sectional view of an ESD protection device according to an embodiment of the present invention.

An electrostatic discharge (ESD) protection device is presented as follows. FIG. 2 schematically depicts a cross-sectional view of an ESD protection device according to an embodiment of the present invention. As shown in FIG. 2, after the substrate 110 and the well 120 are formed, the selective isolation structure 10, a first isolation structure 20 and a second isolation structure 30 are respectively or simultaneously formed in the substrate 110. The selective isolation structure 10, the first isolation structure 20 and the second isolation structure 30 may be shallow trench isolation (STI) structures, which may be formed by a shallow trench isolation (STI) process, but it is not limited thereto. Then, the gate 130 is formed on the well 120, and the drain region 142 and the source region 144 are formed in the well 120. Thereafter, a first doped region 252 is formed in the drain region 142 and in the first isolation structure 20, and the first doped region 252 is electrically connected to the drain region 142, wherein the first doped region 252 has the first conductive type such as N-type. This means the first isolation structure 20 is disposed between the drain region 142 and the first doped region 252, thereby the first isolation structure 20 separating the drain region 142 from the first doped region 252. A second doped region 254 is formed in the source region 144 and in the second isolation structure 30, and the second doped region 254 is electrically connected to the source region 144, wherein the second doped region 254 has the first conductive type such as N-type. This means the second isolation structure 30 is disposed between the source region 144 and the second doped region 254, thereby the second isolation structure 30 separating the source region 144 from the second doped region 254. In a preferred embodiment, the first isolation structure 20 surrounds the first doped region 252, and the second isolation structure 30 surrounds the second doped region 254. In a still preferred embodiment, the first isolation structure 20 extends to a part of the well1 20 below the drain region 142 and the first doped region 252, and the second isolation structure 30 extends to a part of the well1 20 below the source region 144 and the second doped region 254.

A base region 256 is formed in the well 120, and the base region 256 is electrically isolated from the source region 144 by the isolation structure 10, wherein the base region 256 has the first conductive type such as N-type. In a preferred embodiment, the first doped region 252, the second doped region 254 and the base region 256 are formed simultaneously by one same doping process, but it is not limited thereto.

A fifth doped region 262 is selectively formed in the well 120, and is disposed right below the first doped region 252, wherein the fifth doped region 262 has the second conductive type such as P-type. A sixth doped region 264 is selectively formed in the well 120, and is disposed right below the second doped region 254, wherein the sixth doped region 264 has the second conductive type such as P-type. In a preferred embodiment, the fifth doped region 262 and the sixth doped region 264 are formed simultaneously by one same doping process, but it is not limited thereto. In a still preferred embodiment, the first isolation structure 20 surrounds the fifth doped region 262, and the second isolation structure 30 surrounds the sixth doped region 264. Preferably, the first isolation structure 20 extends to a part of the well1 20 below the drain region 142 and the fifth doped region 262, and the second isolation structure 30 extends to a part of the well1 20 below the source region 144 and the sixth doped region 264.

The gate 130 is electrically connected to a gate contact C21. The first doped region 252 and the drain region 142 are electrically connected to a drain contact C22, therefore the first doped region 252 and the drain region 142 having one same electrical potential. The second doped region 254 and the source region 144 are electrically connected to a source contact C23, therefore the second doped region 254 and the source region 144 having one same electrical potential. The base region 256 is electrically connected to a base contact C24. The gate contact C21, the drain contact C22, the source contact C23 and the base contact C24 are electrically connected to other components respectively. Thereby, an electrostatic discharge (ESD) protection device 200 is formed.

Figure 3:
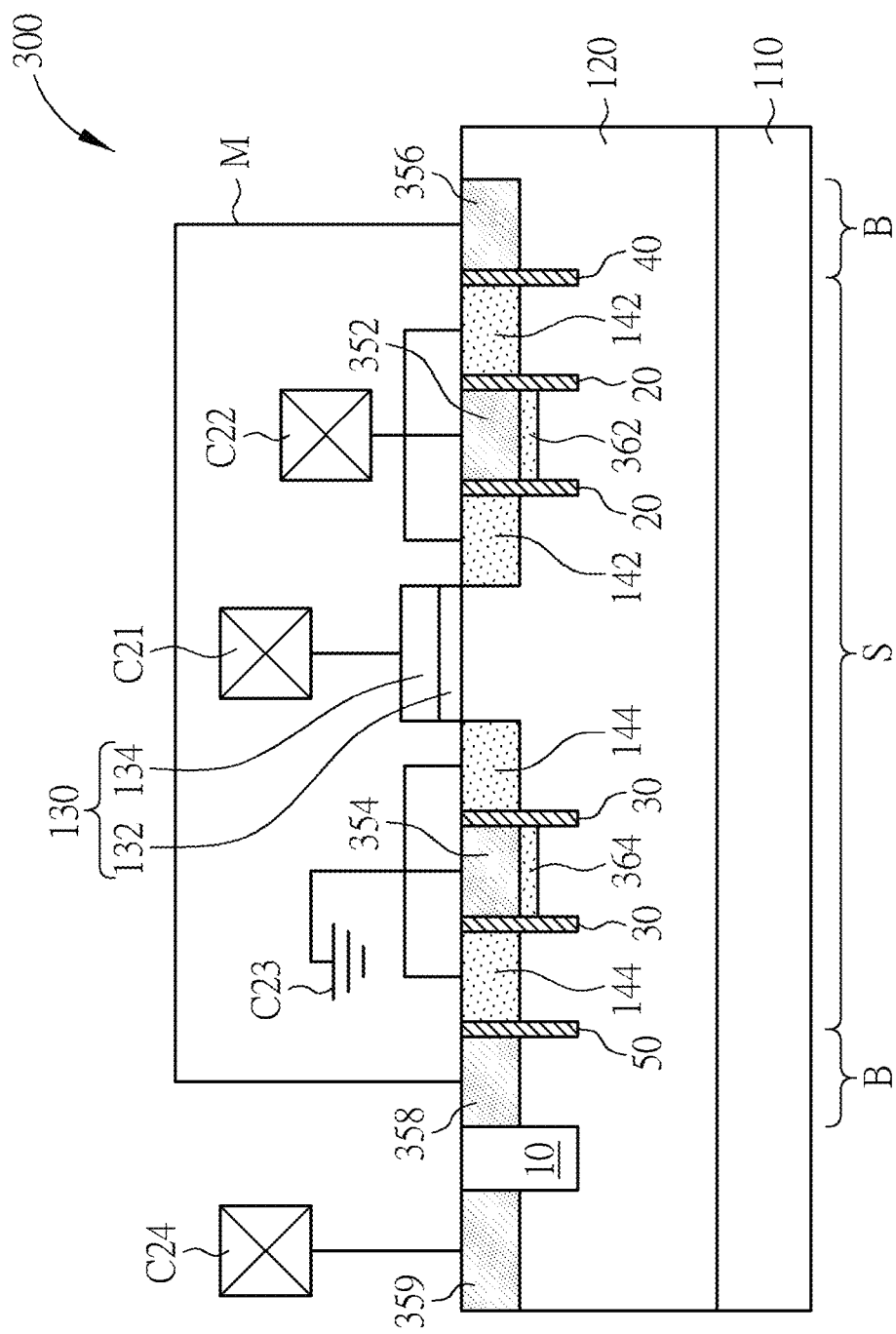
FIG. 3 schematically depicts a cross-sectional view of an ESD protection device according to an embodiment of the present invention.

An improved electrostatic discharge (ESD) protection device is presented as follows. FIG. 3 schematically depicts a cross-sectional view of an ESD protection device according to an embodiment of the present invention. As shown in FIG. 3, after the substrate 110 and the well 120 are formed, the first isolation structure 20, the second isolation structure 30, a third isolation structure 40, a fourth isolation structure 50 and the selective isolation structure 10 (fifth isolation structure) are respectively or simultaneously formed in the substrate 110. The isolation structure 10, the first isolation structure 20, the second isolation structure 30, the third isolation structure 40 and the fourth isolation structure 50 may be shallow trench isolation (STI) structures, which may be formed at a same time by a shallow trench isolation (STI) process, but it is not limited thereto. Then, the gate 130 of FIG. 1 is formed on the well 120, and the drain region 142 and the source region 144 are formed in the well 120.

Thereafter, a first doped region 352 is formed in the drain region 142 and in the first isolation structure 20, and the first doped region 352 is electrically connected to the drain region 142, wherein the first doped region 352 has the first conductive type such as N-type. A second doped region 354 is formed in the source region 144 and in the second isolation structure 30, and the second doped region 354 is electrically connected to the source region 144, wherein the second doped region 354 has the first conductive type such as N-type. In a preferred embodiment, the drain region 142 surrounds the first doped region 352, and the source region 144 surrounds the second doped region 354, but it is not limited thereto. For instance, the first doped region 352 may be one or a plurality of island shape regions in the drain region 142, and the second doped region 354 may be one or a plurality of island shape regions in the source region 144.

A third doped region 356 is formed in the well 120 and at a side of the drain region 142 opposite to the gate 130, wherein the third doped region 356 has the first conductive type such as N-type. The third isolation structure 40 is disposed between the drain region 142 and the third doped region 356, and the third isolation structure 40 separates the drain region 142 from the third doped region 356. A fourth doped region 358 is formed in the well 120 and at a side of the source region 144 opposite to the gate 130, wherein the fourth doped region 358 has the first conductive type such as N-type. The fourth isolation structure 50 is disposed between the source region 144 and the fourth doped region 358, and the fourth isolation structure 50 separates the source region 144 from the fourth doped region 358. In a still preferred embodiment, the third isolation structure 40 extends to a part of the well1 20 below the drain region 142 and the third doped region 356, and the fourth isolation structure 50 extends to a part of the well1 20 below the source region 144 and the fourth doped region 358.

A fifth doped region 362 is selectively formed in the well 120, and is disposed right below the first doped region 352, wherein the fifth doped region 362 has the second conductive type such as P-type. A sixth doped region 364 is selectively formed in the well 120, and is disposed right below the second doped region 354, wherein the sixth doped region 364 has the second conductive type such as P-type. In a preferred embodiment, the fifth doped region 362 and the sixth doped region 364 are formed simultaneously by one same doping process, but it is not limited thereto. In a still preferred embodiment, the first isolation structure 20 surrounds the fifth doped region 362, and the second isolation structure 30 surrounds the sixth doped region 364. Preferably, the first isolation structure 20 extends to a part of the well 20 below the drain region 142 and the fifth doped region 362, and the second isolation structure 30 extends to a part of the well1 20 below the source region 144 and the sixth doped region 364.

A base region 359 is formed in the well 120, the base region 359 is at a side of the fourth doped region 358 opposite to the source region 144, and the base region 359 is electrically isolated from the fourth doped region 358 by the isolation structure 10 (fifth isolation structure), wherein the base region 359 has the first conductive type such as N-type. In a preferred embodiment, the first doped region 352, the second doped region 354, the third doped region 356, the fourth doped region 358 and the base region 359 are formed simultaneously by one same doping process, but it is not limited thereto.

The gate 130 is electrically connected to the gate contact C21. The first doped region 352 and the drain region 142 are electrically connected to the drain contact C22, therefore the first doped region 352 and the drain region 142 having one same electrical potential. The second doped region 354 and the source region 144 are electrically connected to the source contact C23, therefore the second doped region 354 and the source region 144 having one same electrical potential. The base region 359 is electrically connected to the base contact C24. The gate contact C21, the drain contact C22, the source contact C23 and the base contact C24 are electrically connected to other components respectively. An area including the first doped region 352, the second doped region 354, the drain region 142 and the source region 144 constitute an embedded silicon-controlled rectifier (SCR) structure S. It is emphasized that, the third doped region 356 is electrically connected to the fourth doped region 358 by a metal interconnect (or a metal line) M, thus constituting back-to-back diodes B. Therefore, an electrostatic discharge (ESD) protection device 300 is formed.

Figure 4:
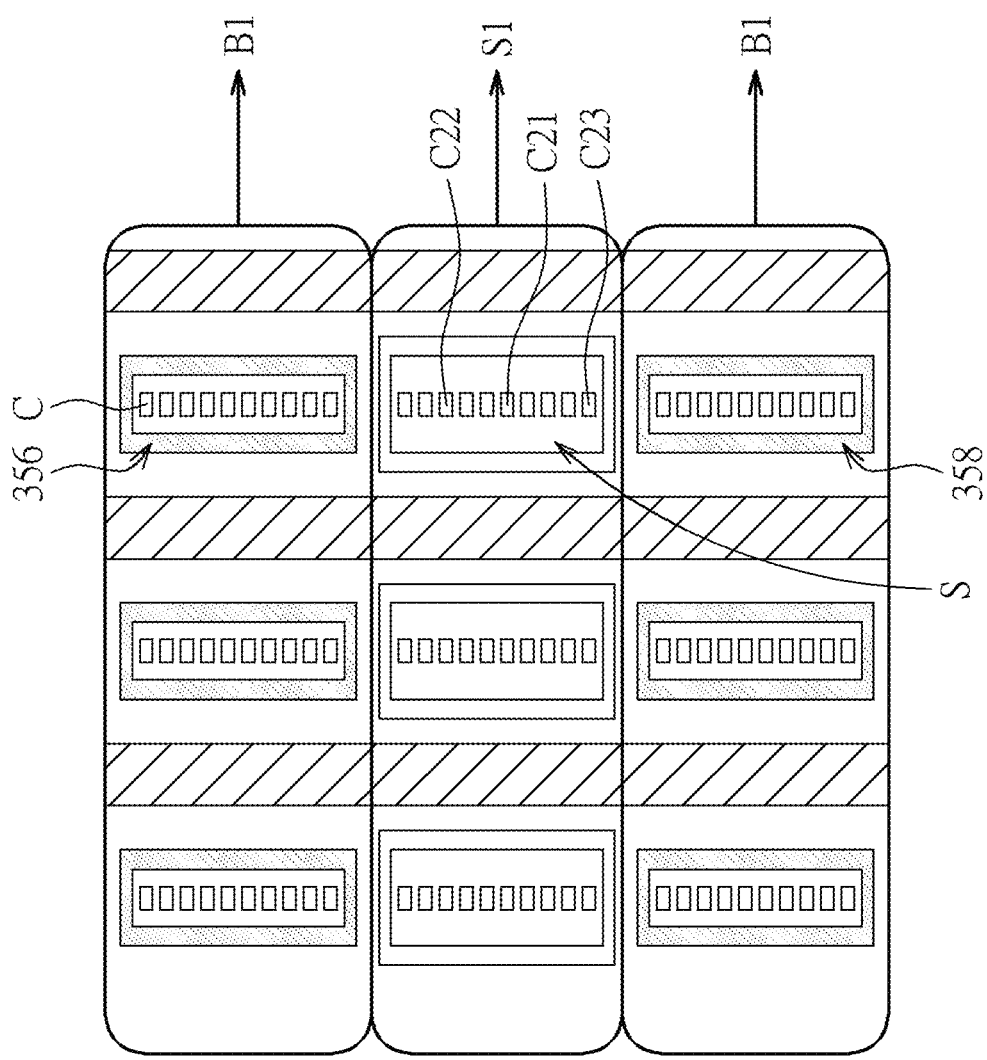
FIG. 4 schematically depicts a top view of an ESD protection device according to an embodiment of the present invention.

FIG. 4 schematically depicts a top view of an ESD protection device according to an embodiment of the present invention. As shown in FIG. 4, the embedded silicon-controlled rectifier (SCR) structure S of FIG. 3 is distributed in a middle area S1 of FIG. 4, wherein each squares in the middle area S1 represents contacts such as the gate contact C21, the drain contact C22 and the source contact C23. The back-to-back diodes B of FIG. 3 are distributed in areas B1 at two sides of the middle area S1, wherein each squares in the areas B1 represents contacts C electrically connecting the two corresponding back-to-back diodes B. In this case, the middle area S1 includes the plurality of embedded silicon-controlled rectifier (SCR) structures S, and the areas B1 includes the plurality of third doped regions 356 and the plurality of fourth doped regions 358, wherein the third doped regions 356 are arranged side by side at a top view, and the fourth doped regions 358 are arranged side by side at a top view.

Figure 5:
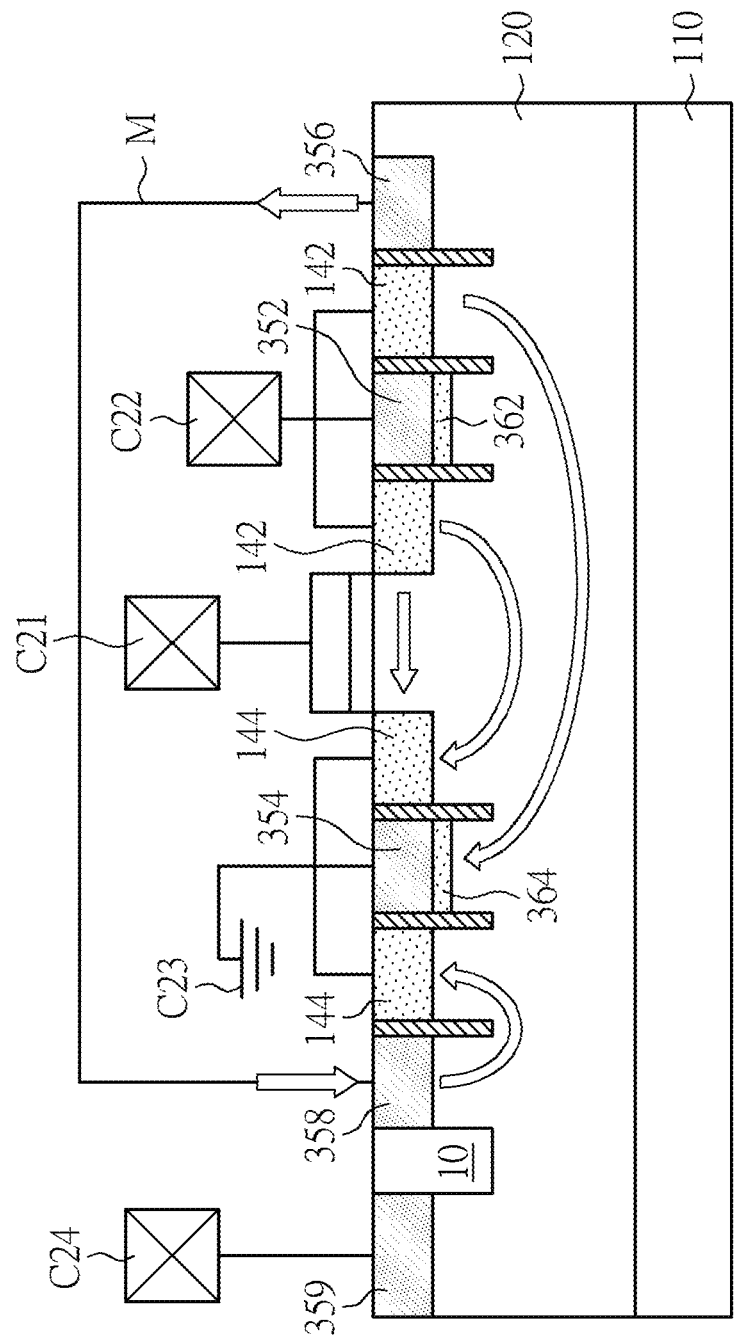
FIG. 5 schematically depicts a current path diagram of an ESD protection device according to an embodiment of the present invention.
Figure 6:
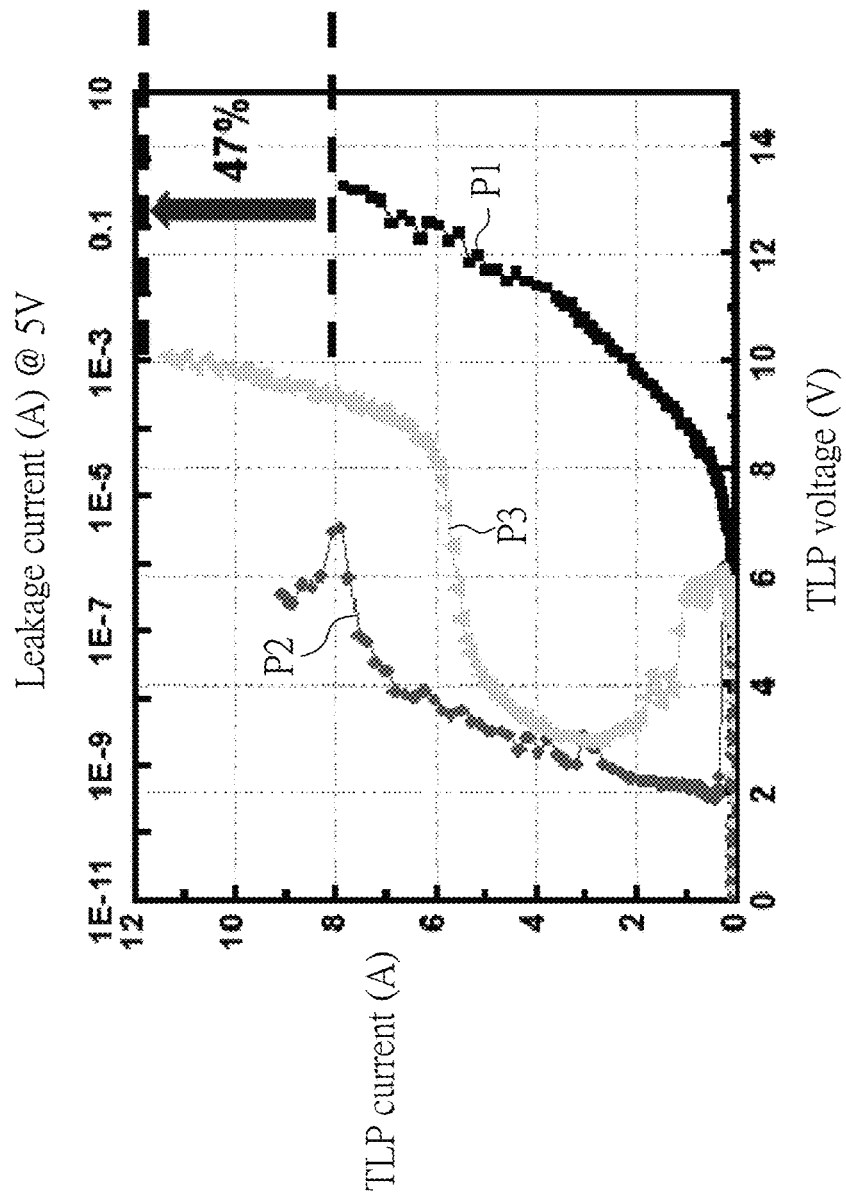
FIG. 6 schematically depicts curves of positive electrostatic discharge current versus voltage in the ESD protection device of FIG. 5.

FIG. 5 schematically depicts a current path diagram of an ESD protection device according to an embodiment of the present invention. As shown in FIG. 5, when the drain region 142 is connected to a voltage V, the source region 144 is connected to ground, and a positive ESD current may pass from the drain region 142 to the source region 144. This positive ESD current may pass through the drain region 142, the well 120 and the source region 144 sequentially; the drain region 142, the well 120, the sixth doped region 364 and the second doped region 354 sequentially; the third doped region 356, the fourth doped region 358, the well 120 and the source region 144 sequentially. FIG. 6 schematically depicts curves of positive electrostatic discharge current versus voltage in the ESD protection device of FIG. 5. Compared to a curve P1 of current versus voltage of the non-ESD protection transistor 100, a curve P2 of current versus voltage of the electrostatic discharge (ESD) protection device 200 and a curve P3 of current versus voltage of the electrostatic discharge (ESD) protection device 300, the threshold voltage of the electrostatic discharge (ESD) protection device 300 is lower than the threshold voltage of the non-ESD protection transistor 100, and the withstanding current of the electrostatic discharge (ESD) protection device 300 is higher than the withstanding current of the electrostatic discharge (ESD) protection device 200 as well as the withstanding current of the non-ESD protection transistor 100, wherein the withstanding current of the electrostatic discharge (ESD) protection device 300 is 47% higher than the withstanding current of the non-ESD protection transistor 100. Thereby, the electrostatic discharge (ESD) protection device 300 has the electrical performance better than those of the non-ESD protection transistor 100 and the electrostatic discharge (ESD) protection device 200.

Figure 7:
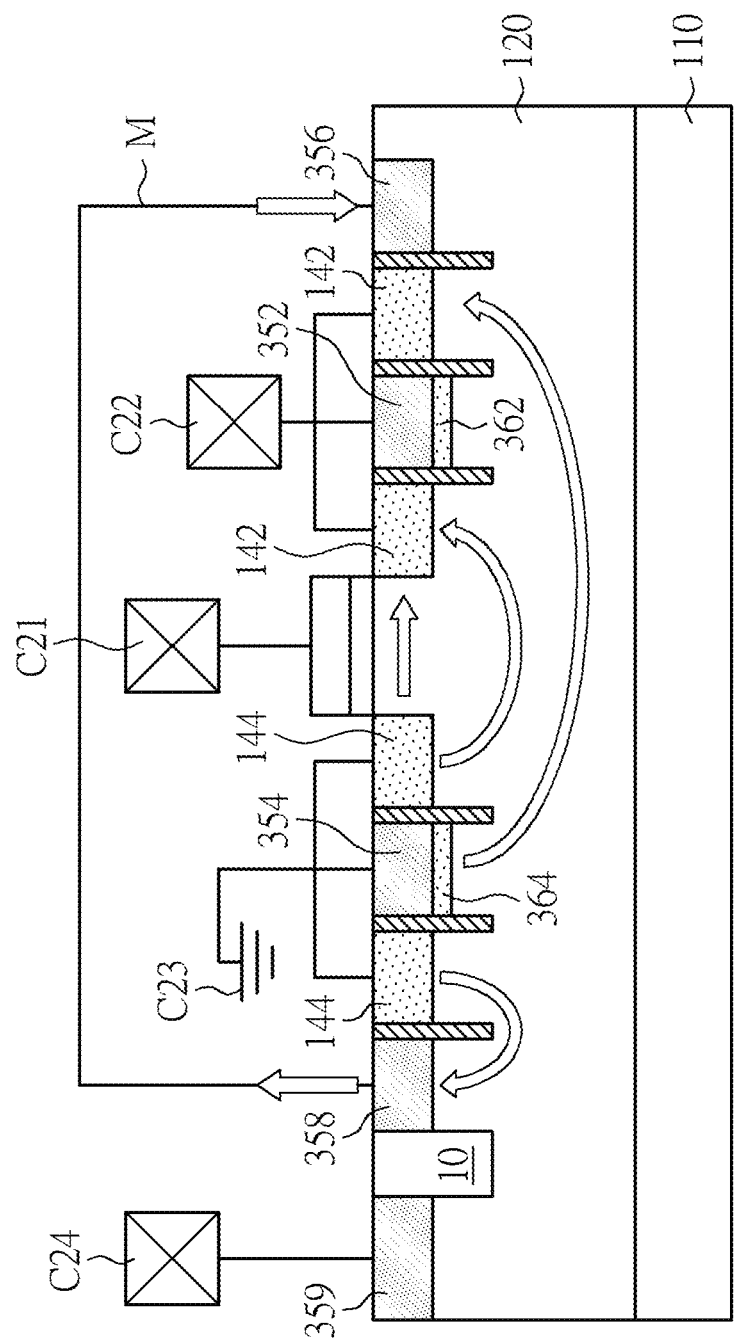
FIG. 7 schematically depicts a current path diagram of an ESD protection device according to an embodiment of the present invention.
Figure 8:
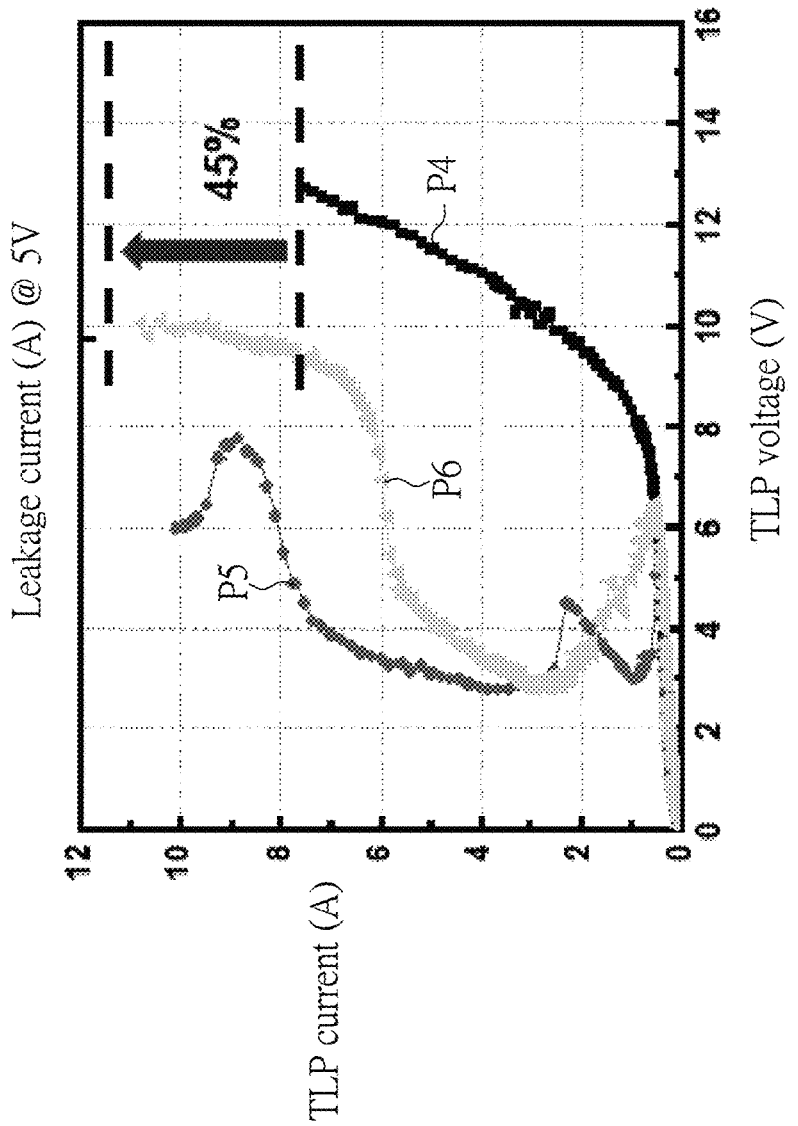
FIG. 8 schematically depicts curves of negative electrostatic discharge current versus voltage in the ESD protection device of FIG. 7.

FIG. 7 schematically depicts a current path diagram of an ESD protection device according to an embodiment of the present invention. As shown in FIG. 7, when the source region 144 is connected to a voltage V, the drain region 142 is connected to ground, and a negative ESD current may pass from the source region 144 to the drain region 142. This negative ESD current may pass through the source region 144, the well 120 and the drain region 142 sequentially; the second doped region 354, the sixth doped region 364, the well 120, and the drain region 142 sequentially; the source region 144, the well 120, the fourth doped region 358 and the third doped region 356 sequentially. FIG. 8 schematically depicts curves of negative electrostatic discharge current versus voltage in the ESD protection device of FIG. 7. Compared to a curve P4 of current versus voltage of the non-ESD protection transistor 100, a curve P5 of current versus voltage of the electrostatic discharge (ESD) protection device 200 and a curve P6 of current versus voltage of the electrostatic discharge (ESD) protection device 300, the threshold voltage of the electrostatic discharge (ESD) protection device 300 is lower than the threshold voltage of the non-ESD protection transistor 100, and the withstanding current of the electrostatic discharge (ESD) protection device 300 is higher than the withstanding current of the electrostatic discharge (ESD) protection device 200 as well as the withstanding current of the non-ESD protection transistor 100, wherein the withstanding current of the electrostatic discharge (ESD) protection device 300 is 45% higher than the withstanding current of the non-ESD protection transistor 100. Thereby, the electrostatic discharge (ESD) protection device 300 has the electrical performance better than those of the non-ESD protection transistor 100 and the electrostatic discharge (ESD) protection device 200.

To summarize, the present invention provides an electrostatic discharge (ESD) protection device and a forming method thereof, which includes a well having a first conductive type disposed in a substrate; a gate disposed on the well; a source region and a drain region both having a second conductive type located in the well and at two opposite sides of the gate respectively, wherein the second conductive type being different from the first conductive type; a first doped region having the first conductive type located in the drain region, wherein the first doped region being electrically connected to the drain region; a second doped region having the first conductive type located in the source region, wherein the second doped region being electrically connected to the source region; a third doped region having the first conductive type located in the well and at a side of the drain region opposite the gate; a fourth doped region having the first conductive type located in the well and at a side of the source region opposite the gate, wherein the fourth doped region being electrically connected to the third doped region. In the electrostatic discharge (ESD) protection device of the present invention, a silicon-controlled rectifier (SCR) structure and a back-to-back diode structure are formed in a MOS transistor. This enhances the electrical performance of bipolar electrostatic discharge (ESD) protection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection device, comprising:
   a well having a first conductive type disposed in a substrate;
   a gate disposed on the well;
   a source region and a drain region both having a second conductive type located in the well and at two opposite sides of the gate respectively, wherein the second conductive type is different from the first conductive type;
   a first doped region having the first conductive type located in the drain region, wherein the drain region surrounds the first doped region, and the source region surrounds the second doped region, and the first doped region is electrically connected to the drain region;
   a second doped region having the first conductive type located in the source region, wherein the second doped region is electrically connected to the source region;
   a third doped region having the first conductive type located in the well and at a side of the drain region opposite to the gate; and
   a fourth doped region having the first conductive type located in the well and at a side of the source region opposite to the gate, wherein the fourth doped region is electrically connected to the third doped region.

2. The electrostatic discharge (ESD) protection device according to claim 1, further comprising:
   a fifth doped region disposed in the well and directly below the first doped region, wherein the fifth doped region has the second conductive type; and
   a sixth doped region disposed in the well and directly below the second doped region, wherein the sixth doped region has the second conductive type.

3. The electrostatic discharge (ESD) protection device according to claim 2, further comprising:
   a first isolation structure disposed between the drain region and the first doped region, and thus the first doped region being separated from the drain region by the first isolation structure; and
   a second isolation structure disposed between the source region and the second doped region, and thus the second doped region being separated from the source region by the second isolation structure.

4. The electrostatic discharge (ESD) protection device according to claim 3, wherein the first isolation structure surrounds the first doped region, and the second isolation structure surrounds the second doped region.

5. The electrostatic discharge (ESD) protection device according to claim 4, wherein the first isolation structure surrounds the fifth doped region, and the second isolation structure surrounds the sixth doped region.

6. The electrostatic discharge (ESD) protection device according to claim 1, further comprising:
   a third isolation structure disposed between the drain region and the third doped region, and thus the third doped region being separated from the drain region by the third isolation structure; and a fourth isolation structure disposed between the source region and the fourth doped region, and thus the fourth doped region being separated from the source region by the fourth isolation structure.

7. The electrostatic discharge (ESD) protection device according to claim 6, wherein the third isolation structure extends to a part of the well under the drain region and the third doped region, and the fourth isolation structure extends to a part of the well under the source region and the fourth doped region.

8. The electrostatic discharge (ESD) protection device according to claim 1, wherein the electrostatic discharge (ESD) protection device comprises the plurality of third doped regions and the plurality of fourth doped regions, wherein the third doped regions are arranged side by side at a top view, and the fourth doped regions are arranged side by side at a top view.

9. The electrostatic discharge (ESD) protection device according to claim 1, wherein an electrical potential of the drain region is equal to an electrical potential of the first doped region, and an electrical potential of the source region is equal to an electrical potential of the second doped region.

10. The electrostatic discharge (ESD) protection device according to claim 1, further comprising:
a base region having the first conductive type located in the well and at a side of the fourth doped region opposite to the source region.

11. The electrostatic discharge (ESD) protection device according to claim 10, further comprising:
a fifth isolation structure disposed between the fourth doped region and the base region, and thus the fourth doped region being separated from the base region by the fifth isolation structure.

12. The electrostatic discharge (ESD) protection device according to claim 1, wherein the substrate has the second conductive type.

13. The electrostatic discharge (ESD) protection device according to claim 12, wherein the first conductive type is N-type while the second conductive type is P-type.

14. A method of forming electrostatic discharge (ESD) protection device, comprising:
providing a substrate;
forming a well having a first conductive type in the substrate;
forming a gate on the well;
forming a source region and a drain region both having a second conductive type in the well and at two opposite sides of the gate respectively, wherein the second conductive type is different from the first conductive type;
forming a first doped region having the first conductive type in the drain region;
forming a second doped region having the first conductive type in the source region;
forming a third doped region having the first conductive type in the well and at a side of the drain region opposite to the gate;
forming a fourth doped region having the first conductive type in the well and at a side of the source region opposite to the gate;
electrically connecting the fourth doped region to the third doped region; and
forming a first isolation structure, a second isolation structure, a third isolation structure and a fourth isolation structure before the source region, the drain region, the first doped region, the second doped region, the third doped region and the fourth doped region are formed, wherein the first isolation structure is between the drain region and the first doped region, the second isolation structure is between the source region and the second doped region, the third isolation structure is between the drain region and the third doped region, and the fourth isolation structure is between the source region and the fourth doped region.

15. The method of forming electrostatic discharge (ESD) protection device according to claim 14, wherein the fourth doped region is electrically connected to the third doped region by a metal interconnect.

16. The method of forming electrostatic discharge (ESD) protection device according to claim 14, wherein the first doped region and the drain region are connected to a drain contact.

17. The method of forming electrostatic discharge (ESD) protection device according to claim 14, wherein the second doped region and the source region are connected to a source contact.

18. The method of forming electrostatic discharge (ESD) protection device according to claim 14, wherein the first doped region is formed in the drain region and the second doped region is formed in the source region after the source region and the drain region are formed.

* * * * *